(12) United States Patent
Hasten et al.

(10) Patent No.: US 6,654,658 B2
(45) Date of Patent: Nov. 25, 2003

(54) SYSTEM AND METHOD FOR CONDITIONING LEADS

(75) Inventors: Paul Harris Hasten, Garland, TX (US); Lew Wai Hong, Singapore (SG)

(73) Assignee: Semiconductor Technologies & Instruments, PTE, Ltd. (SG)

( * ) Notice: Subject to any disclaimer, the term of this patent is extended or adjusted under 35 U.S.C. 154(b) by 305 days.

(21) Appl. No.: 09/741,130

(22) Filed: Dec. 19, 2000

(65) Prior Publication Data

US 2003/0009255 A1 Jan. 9, 2003

(51) Int. Cl.[7] ................................................ B21F 45/00
(52) U.S. Cl. ........................................ 700/121; 140/105
(58) Field of Search .......................... 700/121; 716/4; 29/827; 140/105, 147, 123

(56) References Cited

U.S. PATENT DOCUMENTS

| | | | | |
|---|---|---|---|---|
| 4,765,376 A | * | 8/1988 | Leiwe | 140/147 |
| 5,219,404 A | * | 6/1993 | Moore et al. | 140/147 |
| 5,613,531 A | | 3/1997 | Essig et al. | 140/147 |
| 5,826,630 A | | 10/1998 | Moore et al. | 140/147 |
| 6,014,993 A | * | 1/2000 | Goins, III | 140/105 |

FOREIGN PATENT DOCUMENTS

JP  6-295968  10/1994

OTHER PUBLICATIONS

Patent Abstracts of Japan; abstract translation of Japanese Patent 6–295968.
PCT Search Report dated Aug. 5, 2002.

* cited by examiner

*Primary Examiner*—Leo Picard
*Assistant Examiner*—Alexander Kosowski
(74) *Attorney, Agent, or Firm*—Christopher J. Rourk; Akin Gump Strauss Hauer & Feld, LLP (57) ABSTRACT

A system for conditioning a plurality of semiconductor leads of a semiconductor device is provided. The system includes an array of comb blades, where each comb blade terminates at a notch that allows the semiconductor leads to be moved laterally through the notch. A controller connected to the comb blades, such as through an intervening motor and comb blade support, causes the comb blades to move relative to the semiconductor device, such as by holding the semiconductor device stationary, so as to perform lateral and vertical conditioning of the semiconductor leads.

20 Claims, 5 Drawing Sheets

SYSTEM AND METHOD FOR CONDITIONING LEADS

FIELD OF THE INVENTION

The present invention pertains to the field of semiconductor devices, and more particularly to a system and method for conditioning semiconductor device leads that uses a single structure to perform lateral and vertical lead conditioning on multiple leads of a semiconductor device.

BACKGROUND

Systems and methods for conditioning the leads of semiconductor devices are known in the art. During manufacture, the leads of a semiconductor device may inadvertently be bent or deformed, such that the leads must be either returned to their original condition or the device must be destroyed. The systems and methods for straightening and conditioning leads focus on semiconductor devices for which lead conditioning could possibly return the semiconductor device to a usable condition.

Known systems and methods for conditioning semiconductor leads seek to speed the handling of each device such that it is faster than manual conditioning of the leads. Manual conditioning of the leads is both time consuming, and can result in human error. While many different apparatuses, systems, and methods have been proposed to facilitate the straightening of leads, each requires to some extent manual intervention, involves two or more different structures, or involves a single structure that can only condition one lead at a time.

One drawback with existing systems and methods for conditioning leads is that they are complex and require numerous motors and other moving parts that must be coordinated in order to perform the lead conditioning. For example, it is often necessary to have a first tool that will straighten the leads in a lateral plane, that is, the plane in which all leads lie, and then a second tool to straighten the leads in a vertical plane, that is, the plane in which it is perpendicular to the plane of the leads. Likewise, it is often necessary to have numerous moving parts that must be coordinated and controlled in order to perform the lead conditioning.

Thus, while lead conditioning provides many benefits, systems, methods, and apparatuses for performing lead conditioning are complex and may be prone to breakdown, failure, misoperation, or other problems.

SUMMARY OF THE INVENTION

In accordance with the present invention, a system and method for conditioning semiconductor leads are provided that overcome known problems with auctions.

In particular, a system and method for conditioning semiconductor leads are provided that allow lead conditioning to be performed with a simplified structure that minimizes the number of moving parts of the lead conditioning system, thus decreasing the likelihood of misoperation or breakdown.

In accordance with an exemplary embodiment of the present invention, a system for conditioning a plurality of semiconductor leads of a semiconductor device is provided. The system includes an array of comb blades, where each comb blade has a notch that allows the semiconductor leads to be moved laterally through the notch. A controller connected to the comb blades, such as through an intervening motor and comb blade support, causes the comb blades to move relative to the semiconductor device, such as by holding the semiconductor device stationary, so as to perform lateral and vertical conditioning of the semiconductor leads.

The present invention provides many important technical advantages. One important technical advantage of the present invention is a system and method for conditioning leads that combines the lateral conditioning functionality and vertical conditioning functionality into a single structure, such as a comb blade having a notch that allows lateral conditioning to be performed with the planar portion of the blade, and vertical conditioning to be performed using the notch in the blade. The present invention thus minimizes the number of moving parts required for lead conditioning.

Those skilled in the art will further appreciate the advantages and superior features of the invention together with other important aspects, thereof on reading the detailed description that follows in conjunction with the drawings.

DETAILED DESCRIPTION OF PREFERRED EMBODIMENTS

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

Figure 1:
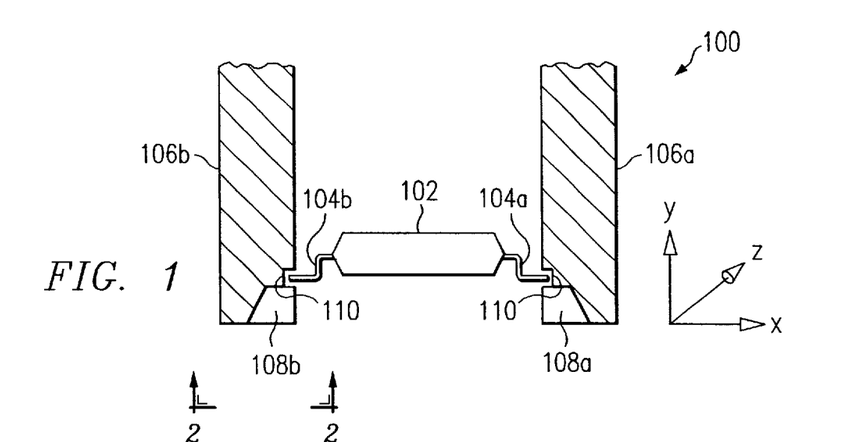
FIG. 1 is a diagram of a system for conditioning leads in accordance with an exemplary embodiment of the present invention.

FIG. 1 is a diagram of a system 100 for conditioning leads in accordance with an exemplary embodiment of the present invention. System 100 uses notched comb blade arrays 108a and 108b to perform lead conditioning in both the lateral and vertical direction.

System 100 includes semiconductor device 102 having gull-wing lead arrays 104a and 104b. As shown in FIG. 1, semiconductor device 102 is a cross sectional view in which the plurality of leads of lead arrays 104a and 104b is seen from the side, such that only two leads in each lead array are visible. Likewise, system 100 includes comb blade supports 106a and 106b and comb blade arrays 108a and 108b, respectively. Each of comb blade arrays 108a and 108b also includes a notch 110.

As shown in the exemplary embodiment of FIG. 1, each of the leads of lead arrays 104a and 104b are contained within the three sides of notch 110 of comb blade arrays 108a and 108b. Each of the leads of lead arrays 104a and 104b are typically made of copper or other suitable conductors, whereas each of the comb blades of comb blade arrays 108a and 108b is formed of a material having a higher material strength and less ductility than the copper or other conducting material of lead arrays 104a and 104b. In this manner, if comb blade arrays 108a or 108b are moved up or down vertically, the top or bottom edge of notch 110, respectively, will come into contact with the corresponding lead of lead arrays 104a and 104b, respectively. Thus, as shown in FIG. 1, comb blade arrays 108 and 108b can be used to perform vertical conditioning of the leads of lead arrays 104a and 104b.

Either of semiconductor device 102 or comb blade supports 106a and 106b can be moved so as to place comb blade arrays 108a and 108b into the space between adjacent leads of lead arrays 104a and 104b. Semiconductor device 102 can then be moved relative to comb blade supports 106a and 106b laterally such that each of the lead arrays 104a and 104b are located beneath a corresponding notch 110 of a comb blade of comb blade arrays 108a and 108b. Either of semiconductor device 102 or comb blade supports 106a and 106b may then be held stationary while the other structure is moved laterally, so as to perform lateral conditioning of the leads of lead arrays 104a and 104b.

Comb blade arrays 108a and 108b and comb blade supports 106a and 106b can be formed from different materials, such that comb blade arrays 108a and 108b are embedded in, welded to, connected to, or otherwise attached to comb blade supports 106a and 106b. Likewise, comb blade arrays 108a and 108b can be extruded, machined, or otherwise formed of the same material used to make comb blade supports 106a and 106b.

In operation, one of semiconductor device 102 or comb blade supports 106a and 106b can be held stationary while the other is raised or lowered so as to move comb blade arrays 108a and 108b between leads arrays 104a and 104b. Likewise, both can be moved where suitable. The comb blade arrays 108a and 108b and lead arrays 104a and 104b can be placed in the positions shown in FIG. 1, such that lead arrays 104a and 104b are aligned with notch 110. Comb blade supports 106a and 106b are then moved laterally by a distance equal to one-half of the distance between the leads of lead arrays 104a and 104b, such that the blades of comb blade arrays 108a and 108b are aligned with lead arrays 104a and 104b, respectively. One of comb blade supports 106a and 106b or semiconductor device 102 can then be moved vertically up or down while the other is held stationary so as to place a stress on each of the leads of lead arrays 104a and 104b, or both can be moved where suitable. In this manner, the leads may be conditioned in the vertical plane so as to lie in a uniform horizontal plane, which may be used to correct leads that have been deformed so as to lie outside of the same plane as the other leads.

One of comb blade arrays 108a and 108b or semiconductor device 102 may then be moved laterally while the other is held stationary so as to move out of the vertical plane of lead arrays 104a and 104b into the planar space between the leads of lead arrays 104a and 104b. One of comb blade supports 106a and 106b and semiconductor device 102 may then be moved vertically while the other is held stationary such that the leads of lead arrays 104a and 104b are moved into a corresponding notch 110 of a comb blade. Likewise, both of comb blade arrays 108a and 108b and lead arrays 104a and 104b can be moved, where suitable. In this manner, semiconductor device 102 can then be moved laterally relative to comb blade arrays 108a and 108b so as to place each lead of lead arrays 104a and 104b laterally against a planar surface of an adjacent comb of comb blade arrays 108a and 108b. In this manner, each lead of lead arrays 104a and 104b can also be conditioned so as to extend perpendicularly from semiconductor device 102 with equal vertical spacing.

Figures 2, 3:
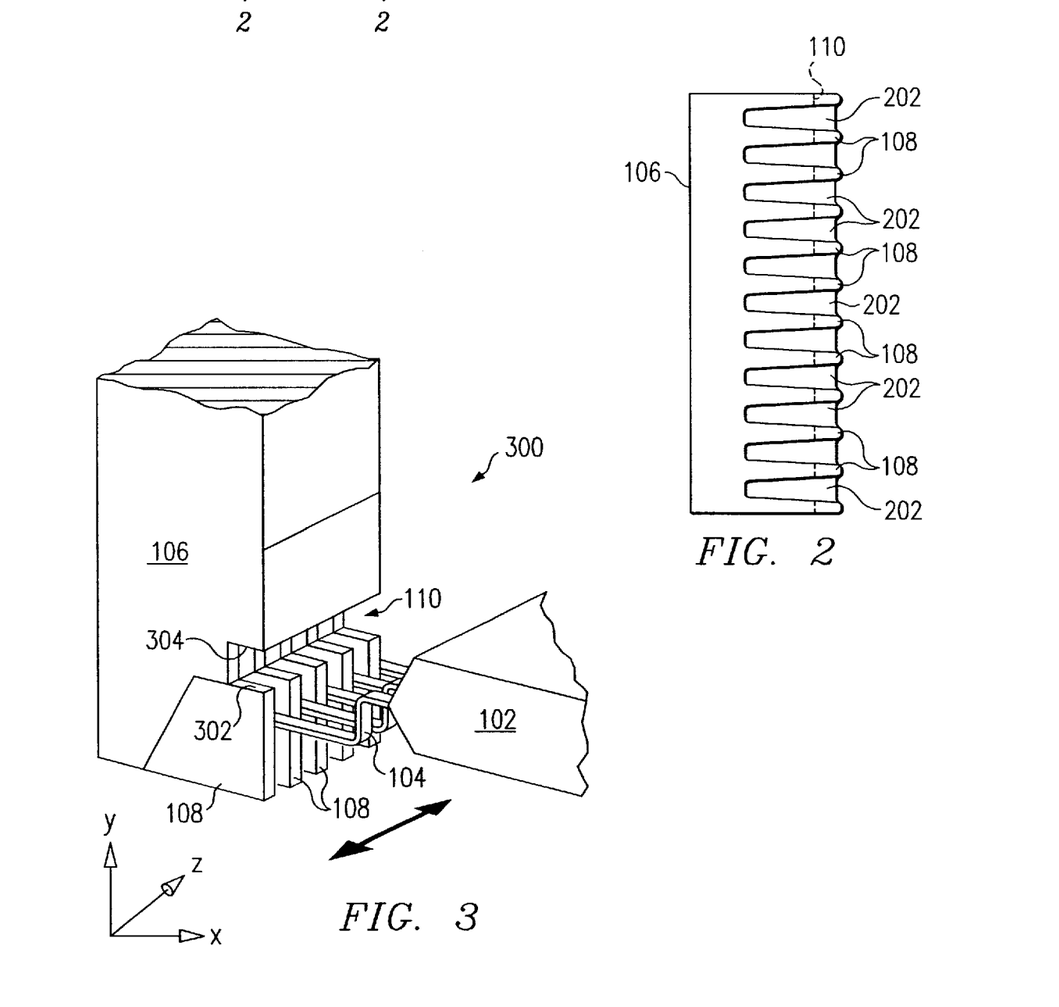
FIG. 2 is a cross section of a comb array and comb supports in accordance with an exemplary embodiment of the present invention.
FIG. 3 is a diagram of a first step in a series of lead conditioning steps for performing lateral conditioning by use of a comb blade, in accordance with an exemplary embodiment of the present invention.

FIG. 2 is a cross section 200 of a comb blade array 108 and comb blade support 106 in accordance with an exemplary embodiment of the present invention. Cross section 200 shows an exemplary embodiment whereby individual comb blades of the comb blade array 108 and the comb blade support 106 holding the comb blade array 108 can be formed from a single extruded or machined material.

As shown in FIG. 2, comb blade support 106 has been machined, extruded, cast, molded, or formed by other suitable processes so as to include the individual comb blades of comb blade array 108. Likewise, slot array 202 makes up the spaces between the comb blades of comb blade array 108. The depth of each slot of slot array 202 is at a maximum at the lower end of comb blade support 106, and decreases in depth until the slot terminates at the outer surface of comb blade support 106. Notch 110 of each comb blade support 106 may then be machined, extruded, cast, molded, or formed by other suitable processes.

In operation, the arrangement of comb blades of comb blade array 108 in comb blade support 106 shown in cross section 200 can be used to provide lead conditioning functionality in accordance with an exemplary embodiment of the present invention. The spaces of slot array 202 between the comb blades of comb blade array 108 are used to hold the leads of lead arrays 104 for lateral conditioning. Likewise, the leads of lead array 104 can be moved relative to comb blade array 108 and comb blade support 106 through slot array 202 until they are in the same lateral plane with notch 110 (not explicitly shown), wherein comb blade support 106 is moved one-half pitch relative to the semiconductor device so as to move the leads of the semiconductor device from the spaces of slot array 202 into alignment with a comb blade of comb blade array 108 at the bottom of notch 110. In this manner, each comb blade can be used to provide for lateral as well as vertical conditioning.

FIG. 3 is a diagram 300 of a first step in a series of lead conditioning steps for performing lateral conditioning by use of a comb blade of comb blade array 108 in accordance with an exemplary embodiment of the present invention. In diagram 300, semiconductor device 102 has been lowered relative to the comb blade shown of comb blade array 108, such as by moving comb blade support 106 in an upwards direction while holding semiconductor device 102 stationary. Likewise, semiconductor device 102 can be moved downward while holding comb blade array 108 stationary in order to move lead array 104 to a position below lower notch surface 304 of notch 110. Comb blade array 108 may then be moved laterally relative to semiconductor device 102 in the direction shown by arrows 306 so as to perform lead conditioning of each lead of lead array 104.

For example, moving comb blade support 106 in the direction shown as the +Z direction of arrow 306 will cause each lead of lead array 104 to come into contact with a comb blade of comb blade array 108, such that the lead may be bent slightly out of perpendicular from the plane of semiconductor device 102 in the −Z direction. Likewise, moving comb blade support 106 in the direction shown as the −Z arrow 306 will cause the lead of lead array 104 to be deformed in the +Z direction by the comb blade adjacent to the lead of lead array 104 shown in FIG. 3. In this manner, leads 104 can be conditioned by moving them in the +Z and the −Z directions.

Figure 4:
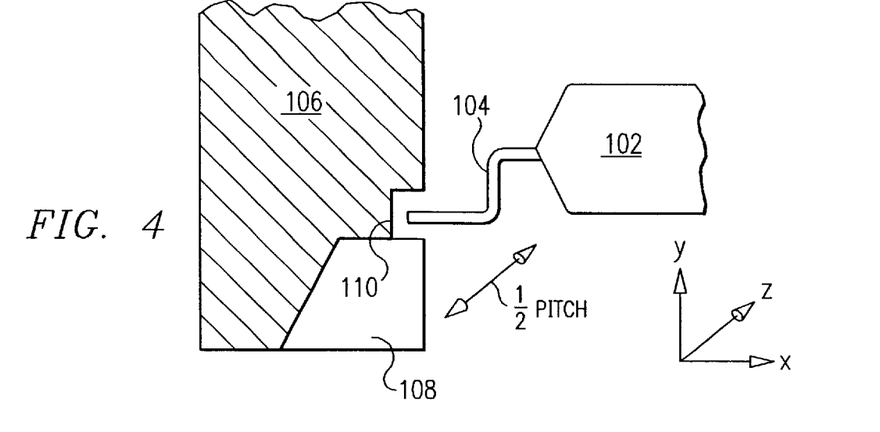
FIG. 4 is a diagram of an exemplary embodiment of a transitional step in the series of lead conditioning steps, in accordance with an exemplary embodiment of the present invention.

FIG. 4 is a diagram 400 of an exemplary embodiment of a transitional step in the series of lead conditioning steps, in accordance with an exemplary embodiment of the present invention. In FIG. 4, semiconductor device 102 has been moved in the +Y direction relative to comb blade array 108, such as by moving semiconductor device 102 in an upwards direction, or holding semiconductor device 102 stationary while moving comb blade array 108 in a downward direction. Semiconducting device 102 is then moved laterally relative to comb blade array 108 by a distance equal to one-half of the pitch between adjacent blades of comb blade array 108, such that lead array 104 is moved into the space created by notch 110. This lateral movement can be accomplished by holding semiconductor device 102 stationary while moving comb blade support 106, or by holding comb blade support 106 stationary while moving semiconductor device 102.

Upon completion of the movement, each lead of lead array 104 is contained on two sides by upper notch surface 302 and lower notch surface 304 of notch 110 and the comb blades of comb blade array 108. In this manner, vertical lead conditioning of each lead of lead array 104 can be performed. Upper notch surface 302 and lower notch surface 304 of notch 110 can be arranged so as to contain leads of lead array 104 that are deformed within a correctable or conditionable amount of deformation. In this manner, conditioning of semiconductor devices having leads that lie above upper notch surface 302 or below lower notch surface 304, and which may therefore be further damaged by lead conditioning, would not result in the loss of any usable devices.

Figure 5:
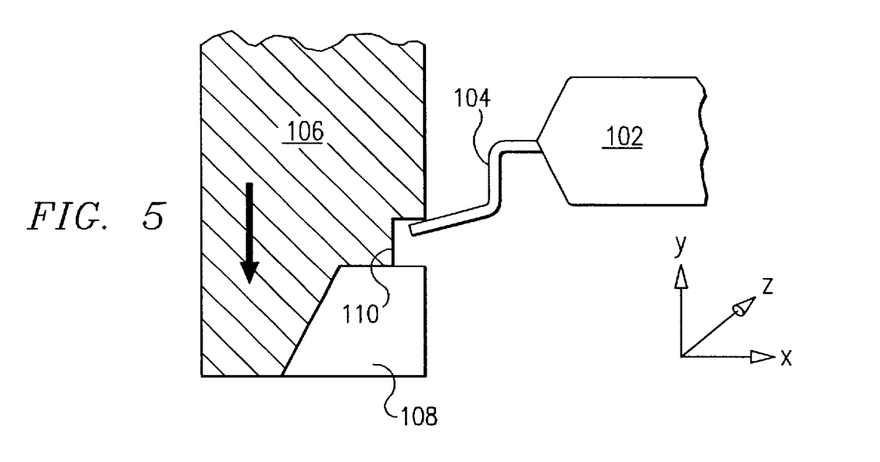
FIG. 5 is a diagram of another step in a series of lead conditioning steps for performing vertical conditioning by use of a comb blade slot, in accordance with an exemplary embodiment of the present invention.

FIG. 5 is a diagram 500 of another step in a series of lead conditioning steps for performing vertical conditioning by use of a comb blade slot, in accordance with an exemplary embodiment of the present invention. Semiconductor device 102 has been moved relative to the position of comb blade array 108 from the location shown in FIG. 4 in the +Y direction, such that upper notch surface 302 of notch 110 is in contact with a corresponding lead of lead array 104. In this manner, each lead of lead array 104 can be deformed by a predetermined amount so as move each lead to a first position.

For example, if the lead tips of leads in lead array 104 are each at different locations along the Y axis, but also lie within notch 110, moving the comb blade array 108 relative to the lead array 104 in the manner shown in diagram 500 will result in the deflection of each lead in the −Y direction, but will also result in the alignment of each lead to a uniform coordinate along the −Y axis. Although all of the leads of lead array 104 may thus be moved out of specified tolerance, they each are placed in a known location, such that subsequent processing may be performed to place them back within a specified tolerance of a desired location.

Figure 6:
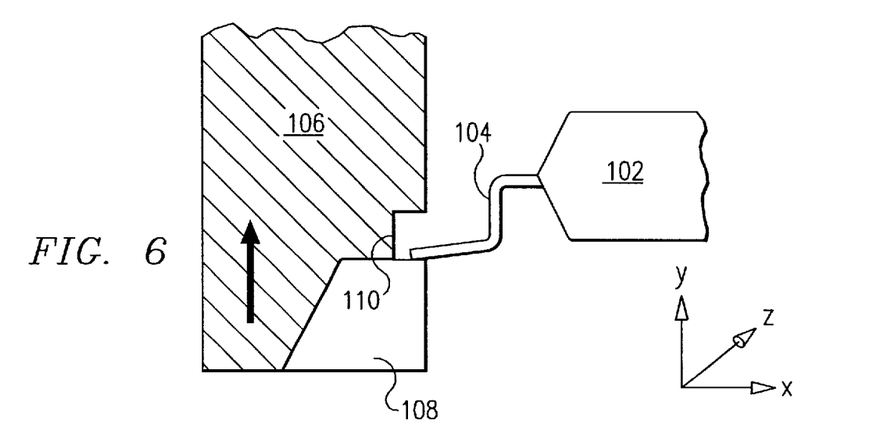
FIG. 6 is a diagram of another step in a series of lead conditioning steps for performing vertical conditioning by use of a comb blade slot, in accordance with an exemplary embodiment of the present invention.

FIG. 6 is a diagram 600 of another step in a series of lead conditioning steps for performing vertical conditioning by use of a comb blade notch 110, in accordance with an exemplary embodiment of the present invention. Semiconductor device 102 has been moved vertically with respect to comb blade array 108 from its location in diagram 500, such as by holding one of semiconductor device 102 or comb blade array 108 stationary while moving the other until lower notch surface 304 comes into contact with a corresponding lead of lead array 104. Each lead of lead array 104 is thus deflected in the direction opposite to that in diagram 500, so as to return the leads of lead array 104 to a predetermined location.

For example, if the lead tips of leads in lead array 104 are each at a uniform location along the Y axis, but are nonetheless outside of a specified range of allowable locations, moving the comb blade array 108 relative to the lead array 104 in the manner shown in diagram 600 will result in the deflection of each lead in the +Y direction, and will also result in the alignment of each lead to a uniform location along the Y axis. In this manner, each of the leads of lead array 104 may thus be moved back to a location that is within a specified tolerance.

In operation, the process shown in the exemplary steps of FIG. 3 through FIG. 6 can be used to condition leads of a semiconducting device so as to lie within a specified tolerance of a desired location. The exemplary steps of FIG. 3 through FIG. 6 can likewise be suitably modified in detail or in sequence so as to accommodate known variations in lead design and lead conditioning processes.

Figure 7:
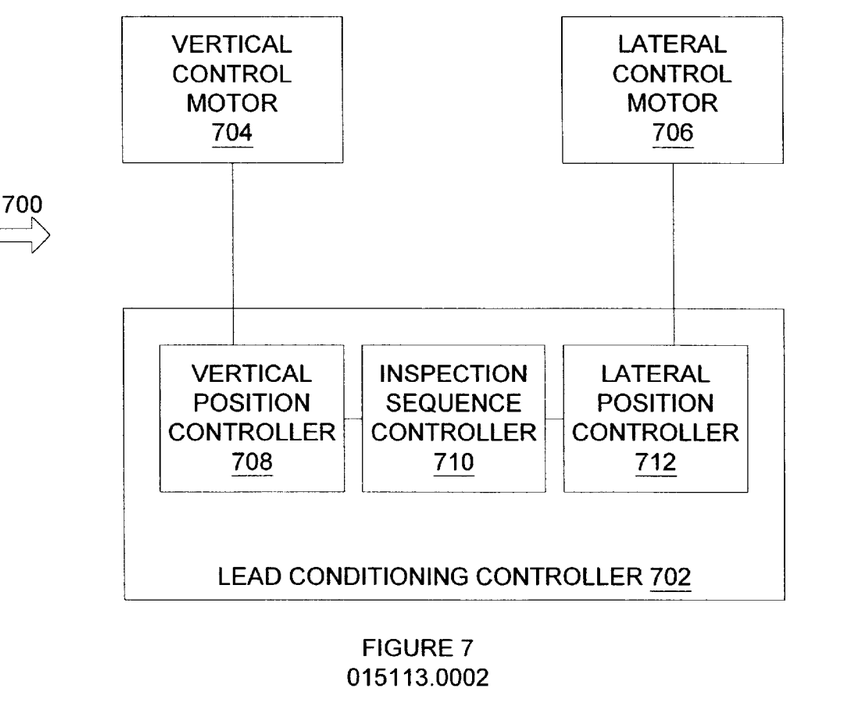
FIG. 7 is a diagram of a system for controlling a lead conditioning system in accordance with an exemplary embodiment of the present invention.

FIG. 7 is a diagram of a system 700 for controlling a lead conditioning system in accordance with an exemplary embodiment of the present invention. System 700 provides lateral and vertical control functionality for use with a suitable lead conditioning system, such as system 100 of FIG. 1.

System 700 includes lead conditioning controller 702, which can be implemented in hardware, software, or a suitable combination of hardware and software, and which can be one or more software systems operating on a general purpose processor platform. As used herein, a software system can include one or more objects, agents, lines of code, threads, subroutines, two or more lines of code or other suitable software structures operating on two or more separate processors, two or more separate lines of code operating in two or more different software applications, or other suitable software architectures. In one exemplary embodiment, a software system can include one or more lines of code or other suitable software structures operating in a general purpose computing software application, such as an operating system, and one or more lines of code operating in a specific purpose software application.

Lead conditioning controller 702 is coupled to vertical control motor 704 and lateral control motor 706. Vertical control motor 704 is used to control the vertical position of a semiconductor device or comb blade support, so as to raise or lower the semiconductor leads relative to the comb blade support. Vertical control motor 704 can be a high accuracy DC step motor, a servo motor, or other suitable motors, and can be coupled to the semiconductor device or comb blade support by a suitable structure that holds the semiconductor device or comb blade support stationary relative to vertical control motor 704.

Lateral control motor 706 is used to control the lateral position of a semiconductor device or comb blade support, so as to move the semiconductor leads laterally relative to the comb blade support. Lateral control motor 706 can be a high accuracy DC step motor, a servo motor, or other suitable motors, and can be coupled to the semiconductor device or comb blade support by a suitable structure that holds the semiconductor device or comb blade support stationary relative to lateral control motor 706.

In one exemplary embodiment, vertical control motor 704 is coupled to comb blade supports 106*a* and 106*b* of system 100. Likewise, lateral control motor 706 is coupled to a semiconductor device brace for holding semiconductor device 102. In this manner, vertical motion of lead arrays 104 semiconductor device 102 relative to comb blade arrays 108*a* and 108*b* is performed by causing vertical control motor 704 to move, whereas lateral motion of lead arrays 104 of semiconductor device 102 relative to comb blade arrays 108*a* and 108*b* can be achieved by motion control of lateral control motor 706. Vertical control motor 704 and lateral control motor 706 can also each be coupled to either of semiconductor device 102 or comb blade supports 106*a* and 106*b* while the other is held stationary. A single motor with a suitable gear assembly can also be used in place of two separate motors for vertical control motor 704 and lateral control motor 706. Two or more motors can also be used for either or both of vertical control motor 704 and lateral control motor 706, such as a high speed motor for movement over large distances and a low speed motor for higher accuracy moves over short distances.

Lead conditioning controller 702 includes vertical position controller 708, inspection sequence controller 710, and lateral position controller 712, each of which can be implemented in hardware, software, or a suitable combination of hardware and software, and which can be one or more software systems operating on a general purpose computing platform. Vertical position controller 708 is coupled to vertical control motor 704, and lateral position controller 712 is coupled to lateral control motor 706. As used herein, the term "couple" and its cognate terms such as "couples" and "coupled" can include a physical connection (such as through a copper conductor), a virtual connection (such as through randomly-assigned data memory locations of a data memory device), a logical connection (such as through logical devices of a semiconducting circuit), other suitable connections, or a suitable combination of such connections. In one exemplary embodiment, systems and components are coupled to other systems and components through intervening systems and components, such as through an operating system of a general purpose computing platform.

Inspection sequence controller 710 can generate motion commands for vertical position controller 708 and lateral position controller 712, to cause vertical position controller 708 to generate control data for vertical control motor 704 and to cause lateral position controller 712 to generate control data for lateral control motor 706 to move so as to perform lead conditioning. In one exemplary embodiment, inspection sequence controller 710 generates commands that correlate to "move to inspection position 1," "perform vertical conditioning," or other suitable commands. These inspection sequence commands are then received by vertical position controller 708, which generates control data to cause vertical control motor 704 to move. In one exemplary embodiment, vertical position controller 708 can include a table having corresponding voltage or current levels that will result in a predetermined movement of vertical control motor 704. In this manner, the command from inspection sequence controller 710 can be translated to a corresponding voltage or current level that causes vertical control motor 704 to move to the required position, to move a required length, or to make other suitable movements.

In one exemplary embodiment, inspection sequence controller 710 generates sequence control data that causes vertical control motor 704 to lower comb blade supports 106*a* and 106*b* over semiconductor device 102, such that comb blade arrays 108*a* and 108*b* are moved into the spaces between leads of lead arrays 104*a* and 104*b* until notch 110 is parallel with the leads of lead arrays 104*a* and 104*b*. Inspection sequence controller 710 then generates commands that cause lateral position controller 712 to generate lateral control motor 706 control signals that cause a semiconductor device support to move semiconductor device 102 laterally, such that lead arrays 104*a* and 104*b* are placed within notches 110 of the comb blades of comb blade arrays 108*a* and 108*b*.

Inspection sequence controller 710 can then generate sequence commands to cause vertical position controller 708 to generate control commands for vertical control motor 704 to cause comb blade supports 106*a* and 106*b* to move vertically such that the leads of lead arrays 104*a* and 104*b* contact the upper notch surface 302 of the notch 110 of each comb blade of comb blade arrays 108*a* and 108*b*, so as to deflect the leads in the vertical plane.

Inspection sequence controller 710 can then generate sequence commands to cause vertical position controller 708 to generate motion control commands to cause vertical control motor 704 to move comb blade supports 106*a* and 106*b* vertically upward so as to place the lower notch surface 304 of notch 110 for each comb blade of comb blade arrays 108*a* and 108*b* in contact with a corresponding lead of lead arrays 104*a* and 104*b*, so as to deflect the leads in the opposite direction. Inspection sequence controller 710 can then repeat the sequence commands for vertical position controller 708 if suitable, until predetermined vertical lead conditioning has been completed.

Inspection sequence controller 710 can then generate sequence commands to cause lateral position controller 712 to generate control commands (such as voltage or current control data) to cause lateral control motor 706 to move semiconductor device 102 in a lateral direction by an amount equal to one-half of the pitch between adjacent leads of lead arrays 104*a* and 104*b*. In this manner, the leads of lead arrays 104*a* and 104*b* are then placed into the spaces between the combs of comb blade arrays 108*a* and 108*b*, such as slot array 202 of FIG. 2.

Inspection sequence controller 710 can then generate sequence commands that cause vertical position controller 708 to generate motor control commands for vertical control motor 704 that cause comb blade supports 106*a* and 106*b* to move vertically, such that lead arrays 104*a* and 104*b* are moved between comb blade arrays 108*a* and 108*b* to a position below the lower notch surface 304 of notch 110 for the comb blades.

Inspection sequence controller 710 can then generate inspection sequence commands to cause lateral position controller 712 to generate motor control commands to cause lateral control motor 706 to move a semiconductor device support laterally, such that lead arrays 104a and 104b come into contact with one of the adjacent combs of comb blade arrays 108a and 108b. In this manner, the lead arrays 104a and 104b are deflected in a first lateral direction. Likewise, inspection sequence controller 710 can then generate inspection sequence commands to cause lateral position controller 712 to generate motor control commands so as to move lateral control motor 706 so as to move the semiconductor device support laterally in the opposite direction, such that the leads of lead arrays 104a and 104b contact the planar comb surfaces of comb blade arrays 108a and 108b on the opposite adjacent side, so as to deflect the leads of lead arrays 104a and 104b in the opposite lateral direction. Inspection sequence controller 710 can then repeat this lateral conditioning until a predetermined number of cycles have been performed, such that the lateral conditioning of lead arrays 104a and 104b is completed.

After completion of the lateral conditioning of the leads, inspection sequence controller 710 can generate inspection sequence commands that cause vertical position controller 708 to generate motor control commands for vertical control motor 704 so that comb blade supports 106a and 106b are raised so as to free semiconductor device 102 from the combs of comb blade arrays 108a and 108b. In this manner, semiconductor device 102 can be removed from the semiconductor support after conditioning of leads has been completed.

In operation, system 700 provides control functionality for two motion control motors, a lateral control motor 706 and a vertical control motor 704. Inspection sequence controller 710 generates inspection controls, such as from a list of predetermined inspection sequence controls, in response to data received from one or more position sensors, or other suitable data. The inspection sequence controls then cause vertical position controller 708 and lateral position controller 712 to generate motor control commands, such as voltage changes or current changes, that cause comb blade supports 106a and 106b or a semiconductor device support to move predetermined distances. In this manner, lead conditioning can be performed on the leads of lead arrays 104a and 104b.

Figure 8:
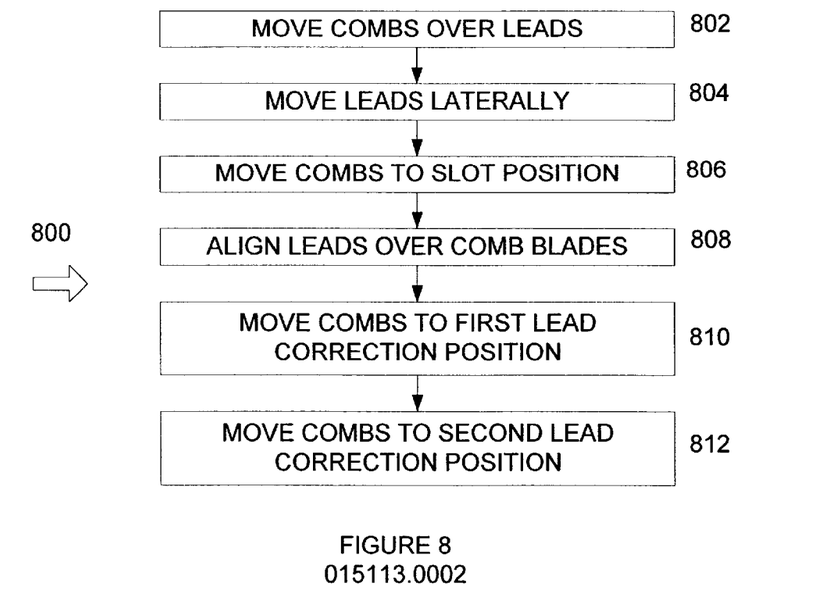
FIG. 8 is a flowchart of a method for conditioning leads of a semiconductor device in accordance with an exemplary embodiment of the present invention.

FIG. 8 is a flowchart of a method 800 for conditioning leads of a semiconductor device in accordance with an exemplary embodiment of the present invention. Method 800 begins at 802 where an array of comb blades is moved over an array of semiconductor device leads. In one exemplary embodiment, the combs can be held by a comb support and can be similar to combs shown in FIG. 1. The method then proceeds to 804 where the semiconductor device is moved laterally so as to perform lateral conditioning of the leads. In this exemplary embodiment, the leads can be aligned beneath a notch that is in or above the comb blades, such as notch 110 of the exemplary embodiment of system 100. The method then proceeds to 806.

At 806, the comb blades are moved vertically to a slot notch position. In this exemplary embodiment, each comb blade terminates at a slot notch, such as notch 110. The comb blades are then moved vertically at 806 so as to align this notch with the expected position of the leads. The method then proceeds to 808.

At 808, the leads are aligned over the comb blades by moving the leads, such as by one-half of the pitch between adjacent leads. In this exemplary embodiment, the semiconductor device can be held in a semiconductor device support, and the semiconductor device support can be moved to accomplish the alignment of the leads over the comb blades within the notch. The method then proceeds to 810. At 810, the comb blades are moved to a first lead correction position in a vertical direction. For example, the comb blades may be held by a comb blade support that is coupled to a vertical control motor, such that the first lead correction position is reached by moving the vertical control motor by a predetermined amount, so as to deflect the leads by a predetermined amount so that the lead tips are each at a predetermined location. The method then proceeds to 810.

At 810, the comb blades are moved to a second lead correction position, such as by changing the direction of the vertical control motor 704 and moving the comb blades vertically downwards to a second predetermined location, such that the leads are placed in contact with a top notch surface and deflected to a second predetermined position that is within a specified tolerance of a desired position for each lead. The comb blades may then be removed from the leads by a suitable process, and the semiconductor device can be inspected to verify whether lead conditioning has been successful.

In operation, method 800 is used to perform semiconductor lead conditioning in a system having an integrated vertical and lateral lead conditioning configuration. Method 800 allows as few as two motors to be used to perform lead conditioning, such that the semiconductor device only needs to be moved vertically and laterally relative to the lead conditioning comb blades. Likewise, additional motors can be used were suitable, such as to move individual comb blades or groups of comb blades.

Figure 9:
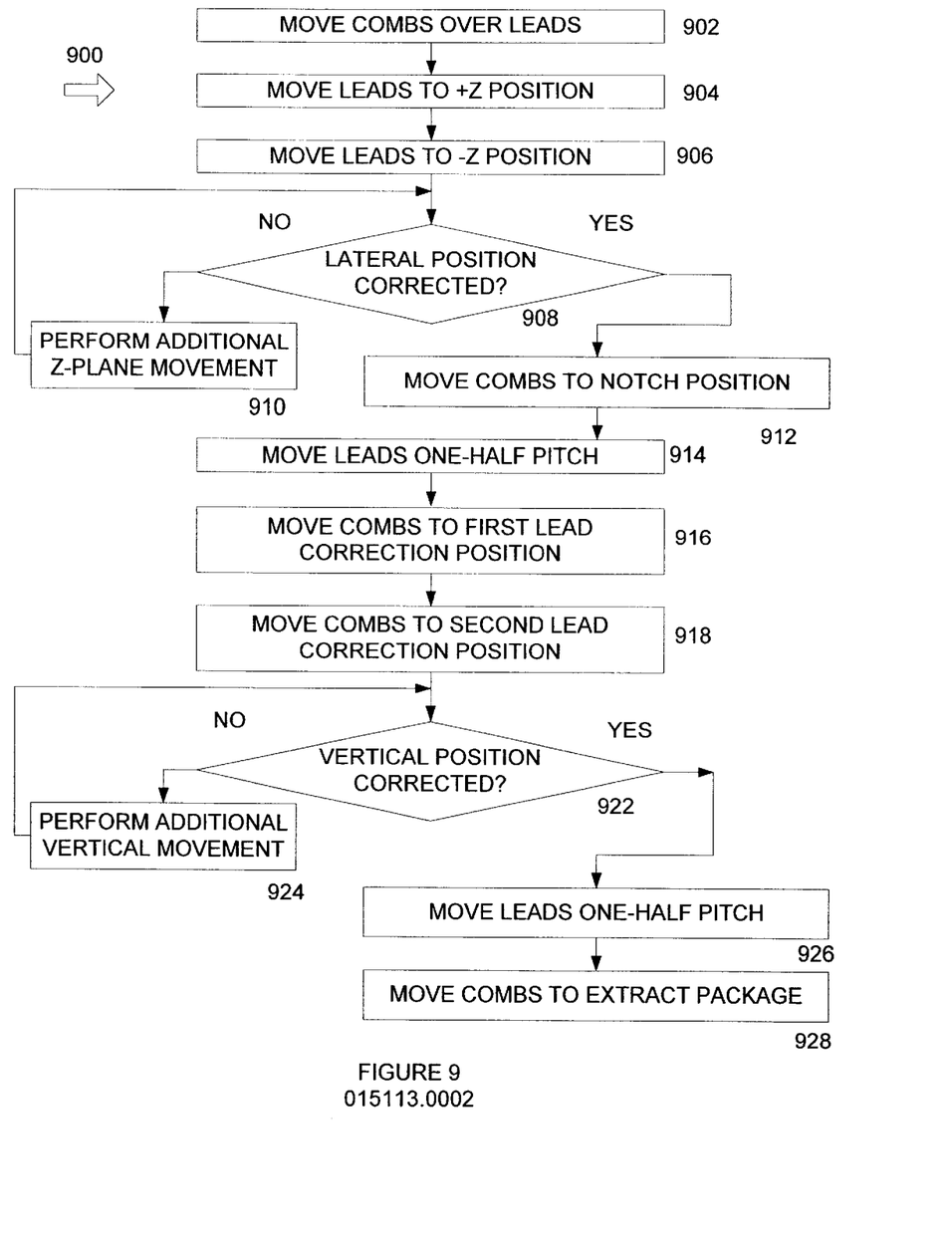
FIG. 9 is a flowchart of method for controlling semiconductor lead conditioning in accordance with an exemplary embodiment of the present invention.

FIG. 9 is a flowchart of method 900 for controlling semiconductor lead conditioning in accordance with an exemplary embodiment of the present invention. Method 900 begins at 902 where one or more combs are moved to a position over the semiconductor leads. In one exemplary embodiment, the combs can be part of a comb support structure and can be moved over the semiconductor leads or semiconductor device held in a semiconductor support. The combs can then be moved vertically down onto the leads, vertically upwards over the leads, or in other suitable manners such that the combs are placed between each lead. The method then proceeds to 904.

At 904, the leads are moved to a +Z position, such that each lead contacts an adjacent comb blade. In one exemplary embodiment, the semiconductor support is moved in a +Z direction while the comb support is held stationary. The method then proceeds to 906.

At 906, the leads are moved to a −Z position relative to the combs, such as by moving the semiconductor support while holding the comb support stationary. The method then proceeds to 906 where it is determined whether the lateral position has been corrected. In one exemplary embodiment, this may be performed on a setup semiconductor device, a group of test semiconductor devices, or other suitable semiconductor devices, or can be determined through the use of feedback monitoring of the semiconductor lead position, such as by storing a digital image of the semiconductor leads and analyzing the image to determine whether the lateral position is correct. If it is determined that lateral position has not been corrected at 908, the method proceeds to 910 where additional Z-plane movement is performed to further condition the leads. The method would then return to 908. Otherwise, the method proceeds to 912.

At 912, the combs are moved to a notch position. In one exemplary embodiment, each comb has a notch having a top notch edge and a bottom notch edge, such that when the combs are moved to the notch position the top notch edge is above the plane of the corresponding semiconductor lead and the bottom notch edge is below the plane of the corresponding semiconductor lead. The method then proceeds to 914.

At 914, the leads are moved one-half pitch. In one exemplary embodiment, the leads are moved one-half pitch by moving a semiconductor device support while holding the comb supports stationary. The method then proceeds to 916 where the combs are moved to a first lead correction position. The lead correction position can be one in which the top slot edge or bottom slot edge are in contact with the semiconductor lead, such that the lead is deflected in a vertical direction. The method then proceeds to 918 where the combs are moved to a second lead correction position. For example, the second lead position correction can flex leads in the opposite vertical direction from the first lead correction position. The method then proceeds to 922.

At 922, it is determined whether the vertical position has been corrected. In one exemplary embodiment, a digital image may be obtained or other suitable data may be obtained to determine whether the leads are each in the suitable position. Other suitable procedures can also be used, such as performing conditioning on a single test piece, on a family of test pieces, or other suitable procedures. If it is determined at 922 that the vertical position has not been corrected, the method proceeds to 924 where additional vertical conditioning is performed. The method then returns to 922. Likewise, if it is determined at 922 that the vertical position has been corrected, the method proceeds to 926.

At 926, the leads are moved laterally one-half pitch, such as by moving the semiconductor device support one-half of a pitch. The method then proceeds to 928. At 928, the combs are moved so as to extract the semiconductor device, such as by vertically extracting the combs in an upward or downward direction.

In operation, method 900 allows semiconductor leads to be conditioned using a comb array wherein each comb further includes a notch, where the planar portion of the comb face is used to perform lateral lead conditioning and the slot edges of the comb are used to perform vertical lead conditioning. Method 900 allows lead conditioning to be performed using two location control systems, such that the number of moving parts for lead conditioning is minimized. Method 900 can also be used in conjunction with sensors to determine whether lead conditioning has been successful, such as to continue lead conditioning if necessary to complete satisfactory lead conditioning.

Figure 10:
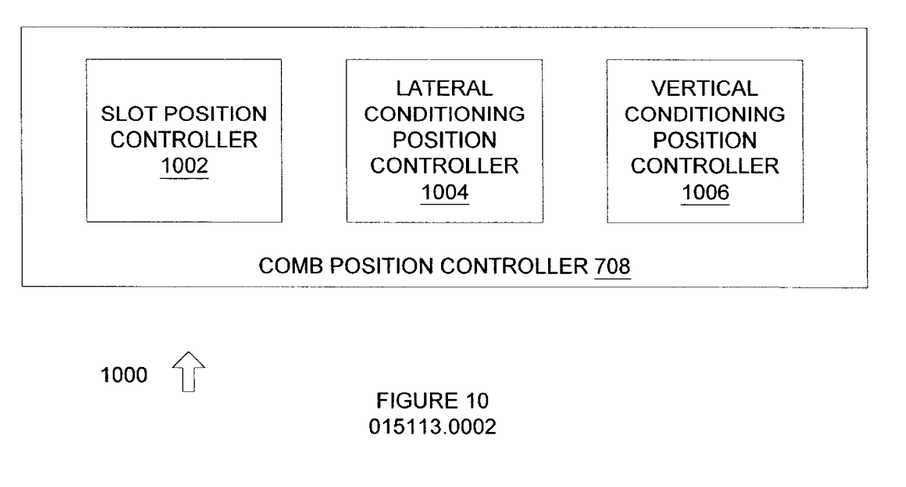
FIG. 10 is a diagram of a system for controlling comb position in accordance with an exemplary embodiment of the present invention.

FIG. 10 is a diagram of a system 1000 for controlling comb position in accordance with an exemplary embodiment of the present invention. System 1000 includes vertical position controller 708 and slot position controller 1002, lateral conditioning position controller 1004, and vertical conditioning position controller 1006, each of which can be implemented in hardware, software, or a suitable combination of hardware and software, and can be one or more software systems operating on a general purpose processing platform.

Slot position controller 1002 receives slot position sequence control data and generates vertical motion control data for a vertical control motor to control the location of leads within a slot. For example, slot position controller 1002 can receive slot position sequence controls for inserting or extracting comb blades between semiconductor leads, and can then generate motor control data such as a number of steps, a control voltage or current level, or other suitable data that causes a corresponding motion control motor to move the comb blades to a predetermined position.

Lateral conditioning position controller 1004 receives lateral conditioning sequence control data and generates vertical control motor control data to cause the comb blade positions to move so as to perform lateral conditioning. For example, the slot position controller 1002 can initially place the comb blades such that the planar portion of the comb blades are adjacent to the leads. Lateral conditioning position controller 1004 can then move the combs vertically to a slot position after completion of lateral conditioning. Likewise, if slot position controller 1002 initially places the combs such that the leads are adjacent to a notch in the combs, lateral positioning controller 1004 can generate motor control commands to cause the combs to move vertically such that the leads are adjacent to planar portions of the combs after completion of vertical conditioning for subsequent lateral conditioning, or generate other suitable control data in response to sequence data.

Vertical conditioning position controller 1006 is used to move the combs to vertical positions during vertical conditioning. In one exemplary embodiment, vertical conditioning position controller 1006 receives sequence data and moves the combs to a first position where an upper slot surface is in contact with the semiconductor leads and causes the semiconductor leads to deflect a predetermined amount. Vertical conditioning position controller 1006 can then receive additional sequence data and generate motor control data that causes the vertical control motor to move the combs to a second position wherein the bottom slot surface defined by each comb is in contact with the lead. In this manner, the semiconductor leads can be flexed and conditioned so as to be placed to a desired position. Vertical conditioning position controller 1006 can also generate other suitable motor control commands in response to sequence data.

In operation, system 1000 provides comb position control functionality for a lead conditioning system. System 1000 provides slot position control, lateral conditioning position control, and vertical conditioning position control, such that a plurality of comb blades can be placed relative to a plurality of semiconductor leads to perform lead conditioning.

Figure 11:
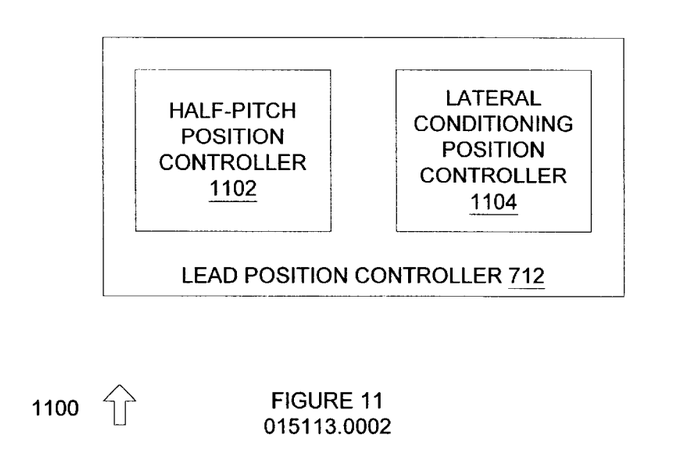
FIG. 11 is a diagram of a system for controlling lateral position of a comb relative to semiconductor device leads in accordance with an exemplary embodiment of the present invention.

FIG. 11 is a diagram of a system 1100 for controlling lateral position in accordance with an exemplary embodiment of the present invention. System 1100 includes lateral position controller 712, half-pitch position controller 1102 and lateral conditioning position controller 1104, each of which can be implemented in hardware, software, or a suitable combination of hardware and software, and which can be one or more software systems operating on a general purpose computing platform.

Half-pitch position controller 1102 receives inspection sequence control data and generates motor control data to cause the location of a semiconductor lead array relative to a comb array to move by one-half of a pitch of the spacing between adjacent combs and/or leads. In one exemplary embodiment, the half-pitch control data can be used to move the leads into position for subsequent vertical conditioning, can be used to extract the leads after completion of vertical conditioning, or can be used to perform other suitable lead movement relative to the comb blades or other suitable structures.

Lateral conditioning position controller 1104 receives inspection sequence data and generates motor control data for performing lateral conditioning of semiconductor leads. In one exemplary embodiment, lateral conditioning position controller 1104 receives a first lateral conditioning position sequence control, and causes the lateral control motor to move a semiconductor support to a first position where the leads of the semiconductor device are in contact with adjacent planar surfaces of a comb blade array. Lateral conditioning position controller 1104 can then receive additional sequence control data and generate motor control data that causes the semiconductor device support to move such that the semiconductor leads are in contact with the adjacent planar comb blade surface. In this manner, lateral conditioning of the semiconductor leads can be performed, by flexing the semiconductor leads in positive and negative lateral directions until the leads are within a predetermined tolerance of a desired position.

In operation, system 1100 is used to control the lateral position of a semiconductor device relative to combs in support of semiconductor lead conditioning. System 1100 can be used to control the lateral position of a semiconductor support, a comb blade support, or other suitable structures so as to move the semiconductor leads laterally relative to the comb blades or other structure.

Although exemplary embodiments of a system and method for conditioning leads have been described in detail herein, those skilled in the art will also recognize that various substitutions and modifications can be made to the systems and methods without departing from the scope and spirit of the appended claims.

What is claimed is:

1. A system for conditioning a plurality of semiconductor leads of a semiconductor device, the system comprising:
    a plurality of comb blades having a predetermined thickness, where each comb blade is separated by a predetermined distance from one or more adjacent comb blades, each comb blade terminating at a notch configured to allow one or more of the semiconductor leads to be moved laterally through the notch;
    a controller coupled to the plurality of comb blades, the controller causing the plurality of comb blades to move relative to the semiconductor device so as to perform lateral and vertical conditioning of the semiconductor leads; and
    a lead position controller receiving lateral control data and generating lead control motor position data in response to the lateral control data, the lead position controller further comprising a half pitch position controller receiving the lateral control data and generating half pitch position control data in response to the lateral control data.

2. The system of claim 1 further comprising a comb control motor coupled to the plurality of comb blades and the controller, the comb control motor receiving comb control motor position data from the controller and moving the plurality of comb blades in a vertical direction relative to the semiconductor leads.

3. The system of claim 1 further comprising a lead control motor coupled to the semiconductor device and the controller, the lead control motor receiving lead control motor position data from the data and moving the semiconductor device in a lateral direction relative to the plurality of comb blades.

4. The system of claim 1 wherein the controller further comprises an inspection sequence controller transmitting a predetermined sequence of lateral control data and vertical control data to one or more position controllers.

5. The system of claim 1 wherein the controller further comprises a comb position controller receiving vertical control data and generating comb control motor position data in response to the vertical control data.

6. The system of claim 5 wherein the comb position controller further comprises a slot position controller receiving the vertical control data and generating slot position data in response to the vertical control data.

7. The system of claim 5 wherein the comb position controller further comprises a lateral conditioning position controller receiving the vertical control data and generating lateral conditioning position data in response to the vertical control data.

8. The system of claim 5 wherein the comb position controller further comprises a vertical conditioning position controller receiving the vertical control data and generating vertical conditioning position data in response to the vertical control data.

9. The system of claim 1 wherein the lead position controller further comprises a lateral conditioning position controller receiving the lateral control data and generating lateral conditioning position data in response to the lateral control data.

10. A method for conditioning a plurality of leads of a semiconductor device comprising:
    placing a plurality of comb blades relative to the semiconductor device, such that one comb blade is between each adjacent pair of leads;
    moving the comb blades laterally relative to the semiconductor device to perform lateral conditioning of the leads;
    moving the comb blades vertically while holding the semiconductor device stationary until the notch is aligned with one or more adjacent lead; and
    moving the semiconductor device laterally in a first direction a distance equal to one half of a pitch between two adjacent blades while holding the comb blades stationary; and
    moving the comb blades vertically relative to the semiconductor device to perform vertical conditioning of the leads.

11. The method of claim 10 wherein placing the plurality of comb blades relative to the semiconductor device, such that one comb blade is between each adjacent pair of leads comprises:
    aligning the plurality of comb blades such that each comb blade is aligned vertically with a space between two adjacent leads; and
    moving the plurality of comb blades vertically such that each comb blade moves into one of the spaces between two adjacent leads.

12. The method of claim 10 wherein moving the comb blades laterally relative to the semiconductor device to perform lateral conditioning of the leads comprises:
    moving the semiconductor device in a first lateral direction from a start position to a first predetermined position;
    moving the semiconductor device opposite to the first lateral direction to a second predetermined position;
    returning the semiconductor device in the first lateral direction to the start position; and
    wherein the comb blades are held stationary while the semiconductor device is moving.

13. The method of claim 10 wherein moving the comb blades vertically relative to the semiconductor device to perform vertical conditioning of the leads comprises:
    moving the comb blades vertically in a first direction so as to deflect the leads from a predetermined amount in a first direction;

moving the comb blades vertically in a direction opposite to the first direction so as to deflect the leads a predetermined amount in a second direction;

moving the comb blades vertically in the first direction so as to return the leads to a desired position; and wherein the semiconductor device is held stationary while the comb blades are moving.

14. A system for conditioning a plurality of semiconductor leads of a semiconductor device, the system comprising:

a semiconductor lead conditioner;

a lead control motor operable to generate relative motion between the semiconductor device and the semiconductor lead conditioner;

a lead position controller receiving lateral control data and generating lead control motor position data in response to the lateral control data; and a half pitch position controller receiving the lateral control data and generating half pitch position control data in response to the lateral control data.

15. The system of claim 14 wherein the semiconductor lead conditioner comprises one or more comb blade arrays.

16. The system of claim 14 wherein the semiconductor lead conditioner is coupled to the lead control motor and the lead control motor moves the semiconductor lead conditioner.

17. The system of claim 14 further comprising a semiconductor device support coupled to the lead control motor, wherein the lead control motor moves the semiconductor device support.

18. The system of claim 14 wherein the semiconductor lead conditioner comprises one or more comb blade arrays coupled to the lead control motor, and the lead control motor moves the semiconductor lead conditioner.

19. The system of claim 14 further comprising:

a semiconductor device support coupled to the lead control motor; and wherein the semiconductor lead conditioner comprises one or more comb blade arrays, and the lead control motor moves the semiconductor device support relative to the comb blade arrays.

20. The system of claim 14 further comprising:

a semiconductor device support; and wherein the semiconductor lead conditioner comprises one or more comb blade arrays, and the lead control motor moves the comb blade arrays relative to the semiconductor device support.

* * * * *